US011500295B2

(12) United States Patent
Shi et al.

(10) Patent No.: US 11,500,295 B2
(45) Date of Patent: Nov. 15, 2022

(54) SYSTEMS AND METHODS FOR CONTACT IMMERSION LITHOGRAPHY

(71) Applicant: Waymo LLC, Mountain View, CA (US)

(72) Inventors: Hongqin Shi, San Jose, CA (US); Yeh-Jiun Tung, Sunnyvale, CA (US); James Dunphy, San Jose, CA (US); Cesar Gensoli, Belmont, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 17/166,743

(22) Filed: Feb. 3, 2021

(65) Prior Publication Data
US 2021/0191276 A1    Jun. 24, 2021

Related U.S. Application Data

(62) Division of application No. 16/724,925, filed on Dec. 23, 2019, now Pat. No. 10,948,830.

(51) Int. Cl.
*G03F 7/20* (2006.01)

(52) U.S. Cl.
CPC ...... *G03F 7/70341* (2013.01); *G03F 7/70925* (2013.01)

(58) Field of Classification Search
CPC ............. G03F 7/70341; G03F 7/70925; G03F 7/2014; G03F 7/0002
See application file for complete search history.

(56) References Cited

U.S. PATENT DOCUMENTS 5,916,374 A * 6/1999 Casey .................. B41F 35/005
                                                      134/37
7,026,259 B2    4/2006 Hakey et al.
(Continued)

FOREIGN PATENT DOCUMENTS

CN    105607414 A  *  5/2016
CN    105652604 A  *  6/2016
(Continued)

OTHER PUBLICATIONS

International Searching Authority, International Search Report and Written Opinion dated Apr. 5, 2021, issued in connection with International Patent Application No. PCT/US2020/063726, filed on Dec. 8, 2020, 10 pages.
(Continued)

*Primary Examiner* — Peter B Kim
(74) *Attorney, Agent, or Firm* — McDonnell Boehnen Hulbert & Berghoff LLP

(57) ABSTRACT

The present application relates to contact immersion lithography exposure units and methods of their use. An example contact exposure unit includes a container configured to contain a fluid material and a substrate disposed within the container. The substrate has a first surface and a second surface, and the substrate includes a photoresist material on at least the first surface. The contact exposure unit includes a photomask disposed within the container. The photomask is optically coupled to the photoresist material by way of a gap comprising the fluid material. The contact exposure unit also includes an inflatable balloon configured to be controllably inflated so as to apply a desired force to the second surface of the substrate to controllably adjust the gap between the photomask and the photoresist material.

19 Claims, 11 Drawing Sheets

(56) References Cited

U.S. PATENT DOCUMENTS

| | | |
|---|---|---|
| 7,230,681 B2 | 6/2007 | Holmes et al. |
| 7,253,879 B2 | 8/2007 | Khmelichek et al. |
| 7,339,650 B2 | 3/2008 | Coon et al. |
| 7,426,014 B2 | 9/2008 | Sogard |
| 8,004,651 B2 | 8/2011 | Nagasaka |
| 8,514,367 B2 | 8/2013 | Binnard |
| 8,619,258 B2 | 12/2013 | Houben |
| 2003/0234919 A1 | 12/2003 | Tajima et al. |
| 2005/0007567 A1 | 1/2005 | Pierrat et al. |
| 2005/0024609 A1 | 2/2005 | De Smit et al. |
| 2005/0213061 A1 | 9/2005 | Hakey et al. |
| 2006/0023181 A1 | 2/2006 | Novak |
| 2006/0023182 A1 | 2/2006 | Novak et al. |
| 2006/0023183 A1 | 2/2006 | Novak et al. |
| 2006/0023187 A1 | 2/2006 | Eaton |
| 2006/0152697 A1 | 7/2006 | Poon et al. |
| 2008/0084006 A1 | 4/2008 | Gao et al. |
| 2008/0100812 A1 | 5/2008 | Poon et al. |
| 2008/0316445 A1 | 12/2008 | Watson et al. |
| 2010/0021577 A1 | 1/2010 | Stewart et al. |
| 2010/0282278 A1 | 11/2010 | Arai |
| 2011/0216292 A1 | 9/2011 | Lafarre et al. |

FOREIGN PATENT DOCUMENTS

| | | | | |
|---|---|---|---|---|
| CN | 111346861 A | * | 6/2020 | |
| EP | 1610366 A1 | * | 12/2005 | ....... H01L 21/02052 |
| KR | 20140003170 U | * | 5/2014 | ............... G03F 1/82 |

OTHER PUBLICATIONS

Malik et al., "Immersion Lithography Process and Control Challenges," Yield Management Solutions, www.kla-tencor.com/ymsmagazine, Spring 2007, pp. 7-17.

Wei et al., "193nn Immersion Lithography: Status and Challenges," SPIE, https://spie.org/news/immersionlitho-intro?SSO=1, Mar. 22, 2007, 6 pages.

\* cited by examiner

SYSTEMS AND METHODS FOR CONTACT IMMERSION LITHOGRAPHY

CROSS-REFERENCE TO RELATED APPLICATION

The present application is a divisional of U.S. patent application Ser. No. 16/724,925, filed Dec. 23, 2019, the content of which is herewith incorporated by reference.

BACKGROUND

The manufacture of various optical components such as light guides and other optical devices may be performed with oblique contact immersion lithography. In such scenarios, achieving sharp corners/edges in photoresist is beneficial to achieve high optical transmission efficiency of waveguiding structures. However, to achieve sharp corners/edges, the substrate/photoresist is typically placed very close to the photomask. However, the substrate is not in direct contact with the mask, in order to avoid having the photoresist stick to the mask. For example, if photoresist sticks to the mask, the process may fail. Accordingly, there is a need for a way to controllably adjust the gap between the substrate/photoresist and the photomask.

SUMMARY

Example embodiments relate to devices, systems, and methods for performing contact immersion lithography exposures.

In a first aspect, an exposure unit is provided. The exposure unit includes a container configured to contain a fluid material and a substrate disposed within the container. The substrate has a first surface and a second surface. The substrate includes a photoresist material on at least the first surface. The exposure unit also includes a photomask disposed within the container. The photomask is optically coupled to the photoresist material by way of a gap comprising the fluid material. The exposure unit also includes an inflatable balloon configured to be controllably inflated so as to apply a desired force to the second surface of the substrate to controllably adjust the gap between the photomask and the photoresist material.

In a second aspect, an exposure unit is provided. The exposure unit includes a container configured to contain a fluid material and a photomask disposed inside the container. The exposure unit includes at least one mask cleaning device disposed inside the container. The at least one mask cleaning device is configured to clean at least one surface of the photomask.

In a third aspect, a method is provided. The method includes controllably inflating an inflatable balloon so as to control a gap between a photomask and a photoresist material disposed on a first surface of a substrate. The gap includes a fluid material. Controllably inflating the inflatable balloon includes applying a desired force to a second surface of the substrate.

Other aspects, embodiments, and implementations will become apparent to those of ordinary skill in the art by reading the following detailed description, with reference where appropriate to the accompanying drawings.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

As described herein, systems and methods to maintain a very thin gap of fluid material between a substrate and a photomask are disclosed. An adjustable mechanism is used to apply a selectable or desirable force to the substrate. In one example, an inflatable balloon may be utilized to press along a backside of the substrate to controllably adjust the gap between the substrate and photomask. In such a scenario, the gap can be adjusted by controlling the pressing force and time. By using an inflatable balloon, an even pressure can be achieved, e.g. near constant force over each area element. This can help make or keep the gap uniform. Alternative or additional mechanisms may include a foam or array of springs.

Further, in contact immersion lithography applications, cleanliness of the fluid material is an important factor to achieve high quality lithography. For example, even small particles (~0.1 um) in the fluid material can slowly accumulate at the edges of patterns on photomask. These small particles may degrade the side walls of an optical light guide, making them rough and causing a decrease in light guide efficiency. Such particles may originate from the environment (ambient air), operator, equipment, and/or substrate/photoresist.

As a possible solution to achieving cleanliness, in additional to multistage particle filtering, a sweeping fluid jet and/or a sweeping wiper or other mechanical cleaning methods could be used to remove particles in the fluid material. Additionally, a slow fluid flow could be provided across the photomask surface to remove bubbles from the lithography optical path.

II. Example Immersion Exposure Units

Figure 1:
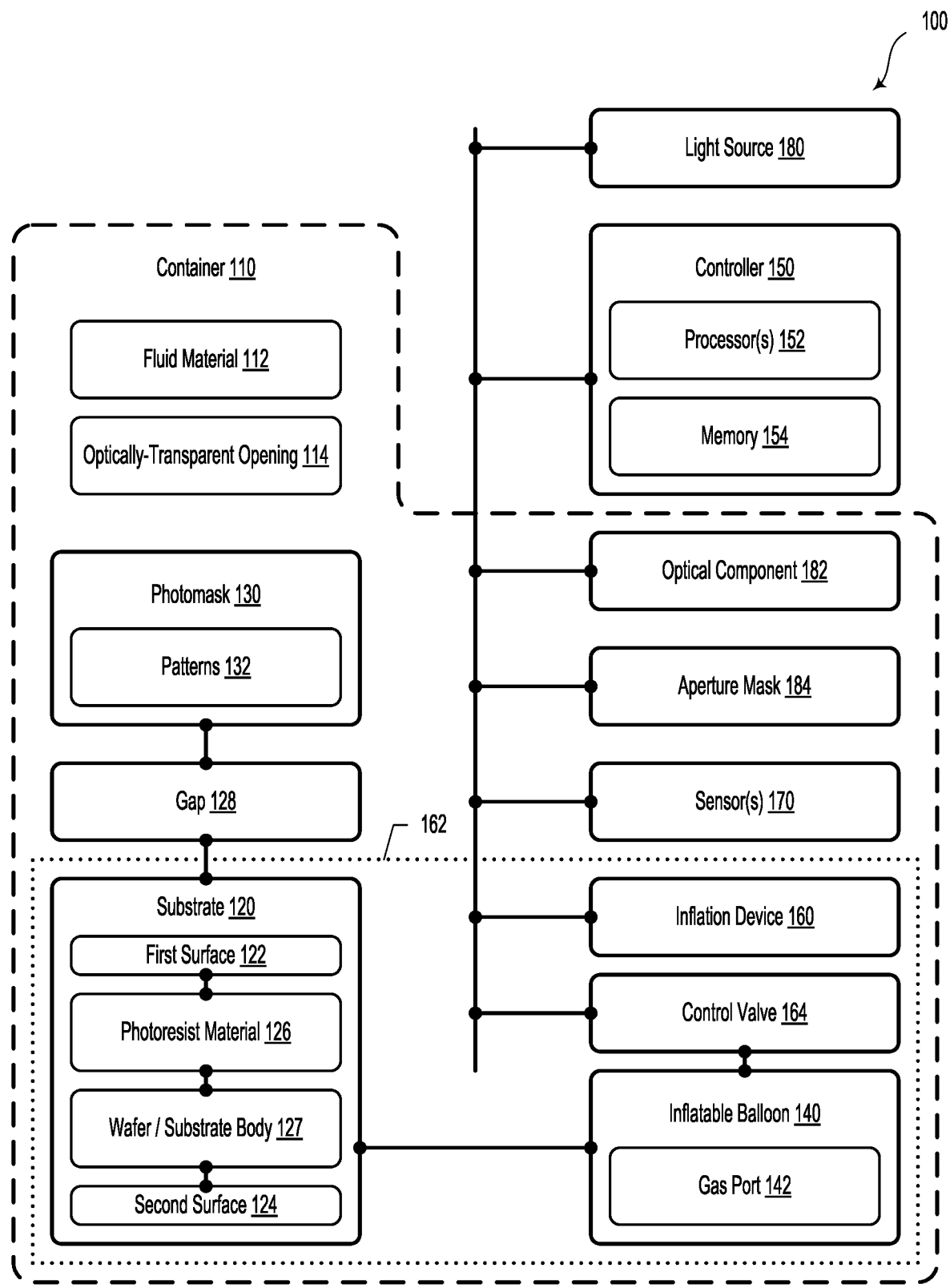
FIG. 1 illustrates a contact immersion lithography exposure unit, according to an example embodiment.

FIG. 1 illustrates a contact immersion lithography exposure unit 100, according to an example embodiment. The contact exposure unit 100 include a container 110 configured to contain a fluid material 112. In some embodiments, the fluid material 112 could include at least one of: water (e.g., deionized water), glycol, or glycerol. Additionally or alternatively, the fluid material 112 could include a mixture of two or more different materials (e.g., water and glycerol). It will be understood that many other fluid materials could be utilized in the contact immersion lithography processes described herein, and all such variations are contemplated and possible within the scope of the present disclosure.

The contact exposure unit 100 also includes a substrate 120 disposed within the container 110. The substrate has a first surface 122 and a second surface 124. The substrate 120 includes a photoresist material 126, which may form at least the first surface 122 of the substrate 120. For example, the substrate 120 could include a wafer/substrate body 127 that is coated with the photoresist material 126 to form the first surface 122. A backside surface of the wafer/substrate body 127 could form the second surface 124. The wafer/substrate body 127 could include a full wafer substrate (e.g., 6 inch wafer) or a portion of a wafer substrate (e.g., 1 cm×1 cm sample). In such scenarios, the wafer/substrate body 127 could be formed from silicon, gallium arsenide, or another semiconductor material. In other examples, the wafer/substrate body 127 could be another type of solid material, such as glass.

In such scenarios, the substrate 120 may be immersed in the fluid material 112 (e.g., water) so as to enable contact immersion lithography processes. As such, it is beneficial to keep the fluid material 112 clean and free from particles or dust from the environment or generated by the exposure process.

The contact exposure unit 100 further includes a photomask 130 disposed within the container 110. The photomask 130 is optically coupled to the photoresist material 126 by way of a gap 128 comprising the fluid material 112. In some embodiments, it may be desirable to maintain a uniform, very narrow fluid gap between the wafer (e.g., substrate 120) and photomask 130 to achieve the desired structures (e.g., angled photoresist structures). The term "contact immersion lithography", as described herein, relates to and/or is particularly relevant to the illumination of photoresist (immersed in a liquid) at varying (and potentially steep) angles of incidence so as to form angled structures in the developed photoresist.

In some embodiments, photolithography processes may be affected by different gaps between the substrate 120 and photomask 130 during exposure. As an example, if the gap between the substrate 120 and the photomask 130 is greater than approximately 20 microns, the projected image of the photomask 130 on the photoresist material 126 could be out of focus. Accordingly, the developed photoresist could include rounded corners and other non-idealities due to the blurred illumination light. For applications where the photoresist structures are used for optical applications (e.g., waveguiding), rounding or chamfer of the waveguides could reduce the optical transmission efficiency of the device.

In contrast, if the fluid gap between the substrate 120 and the photomask 130 is less than approximately 10 microns during exposure, the developed photoresist structures may be sharper with better-defined edge features.

It can be challenging to achieve the proper narrow gap between the substrate 120 and the photomask 130 because direct contact between the substrate 120 and the photomask 130 may lead to sticking, scratching, and/or breakage. Additionally, it can be difficult to utilize thin spacers or shims to physically maintain the desired gap. For example, the spacers or shims would need to be in a region without photoresist so as to prevent photoresist from sticking to the spacer or shim. Furthermore, it can be difficult to handle ~10 micron thick shim material.

Accordingly, the described contact exposure unit 100 additionally includes an adjustable mechanism that is controllable to apply a selectable or desirable force to the substrate. For example, the mechanism may include an inflatable balloon 140 configured to be controllably inflated so as to apply a desired force to the second surface 124 of the substrate 120. An inflatable balloon can provide a simple but finely controllable and uniform pressure on the substrate. Alternative or additional mechanisms may include a foam or array of springs. Accordingly, embodiments described herein may be configured to controllably adjust the gap 128 between the photomask 130 and the first surface 122 of the substrate 120.

In some embodiments, the inflatable balloon 140 may be shaped and/or inflated so as to provide the nearly uniform force (near constant force over each area element) across the second surface 124 of the substrate 120. As such, the inflatable balloon 140 may help provide a uniform gap between photoresist material 126 and photomask 130. The inflatable balloon 140 could be formed from neoprene or another type of inflatable, flexible material (e.g., latex, rubber, etc.). In some embodiments, the inflatable balloon 140 may be made from non-reflective materials and/or light-absorbing materials. For example, the inflatable balloon 140 may be made from or coated with a material that absorbs UV light of the same wavelength as the UV exposure light wavelength.

In some embodiments, the contact exposure unit 100 may additionally include an inflation device 160 configured to controllably inflate the inflatable balloon 140. In an example embodiment, the inflation device 160 may provide a fluid, which may include a liquid or a gas (e.g., air), to the inflatable balloon 140 via a control valve 164. In some examples, the control valve 164 could include one or more mass flow controllers (MFCs) or other types of adjustable flow valves. While embodiments herein describe the inflation device 160 as providing a force on the substrate 120 to adjust the gap 128, it will be understood that other controllable-force elements configured to provide a force on the second surface 124 of the substrate 120 are possible and contemplated. For example, such controllable-force elements could include a foam, a piezoelectric material, a hydraulic element, or an array of springs.

Additionally or alternatively, the contact exposure unit 100 could include a controller 150 having at least one processor 152 and a memory 154. In such scenarios, the at least one processor 152 could be configured to execute program instructions stored in the memory 154 so as to carry out certain operations.

The operations could include controlling the inflation device 160 to inflate the inflatable balloon 140 so as to achieve a desired gap between the photomask 130 and the photoresist material 126. In some embodiments, the gap 128 between the photomask 130 and the photoresist material 126 may be monitored and/or adjusted based on information received from one or more sensors 170. The sensors 170 could include a laser interferometer, a camera, a depth gauge, or another type of distance-measurement sensor. In such a way, the sensors 170 could be configured to provide, to the controller 150, information indicative of an actual distance (e.g., the gap 128) between the photomask 130 and the photoresist material 126.

In some embodiments, the contact exposure unit 100 may additionally include a light source 180 configured to produce illumination light. In such scenarios, the light source 180 is optically coupled to the container 110. The light source 180 could be, for example, a collimated ultraviolet (UV) lamp. It will be understood that other types of light sources suitable for photolithography methods are possible and contemplated.

In example embodiments, the container 110 could include an optically-transparent opening 114. In such scenarios, the illumination light illuminates the photoresist material 126 by way of the optically-transparent opening 114. While FIG. 1 illustrates some elements of system 100 as being inside the container 110, it will be understood that in other embodiments, such elements could be outside the container 110, and vice versa.

In various embodiments, the contact exposure unit 100 may also include an optical component 182 configured to direct the illumination light from the light source 180 to illuminate the photoresist material 126 at a desired angle and to expose at least an angled structure in the photoresist material 126. In such scenarios, the optical component 182 includes at least one mirror arranged to reflect at least a portion of the illumination light to illuminate the photoresist material 126 at the desired angle.

In some embodiments, the desired angle could be substantially 45 degrees with respect to a surface of the substrate. It will be understood that other desired angles (e.g., angles between 15-80 degrees with respect to the first surface 122 of the substrate 120) are possible and contemplated.

In various embodiments, the contact exposure unit 100 could include an aperture mask 184 disposed between the light source 180 and the substrate 120. The aperture mask 184 includes one or more openings. Each opening in the aperture mask 184 could correspond to respective desired structures in the photoresist material 126. In some example embodiments, the respective desired structures could include at least one of: an angled structure or a vertical structure.

Figure 2:
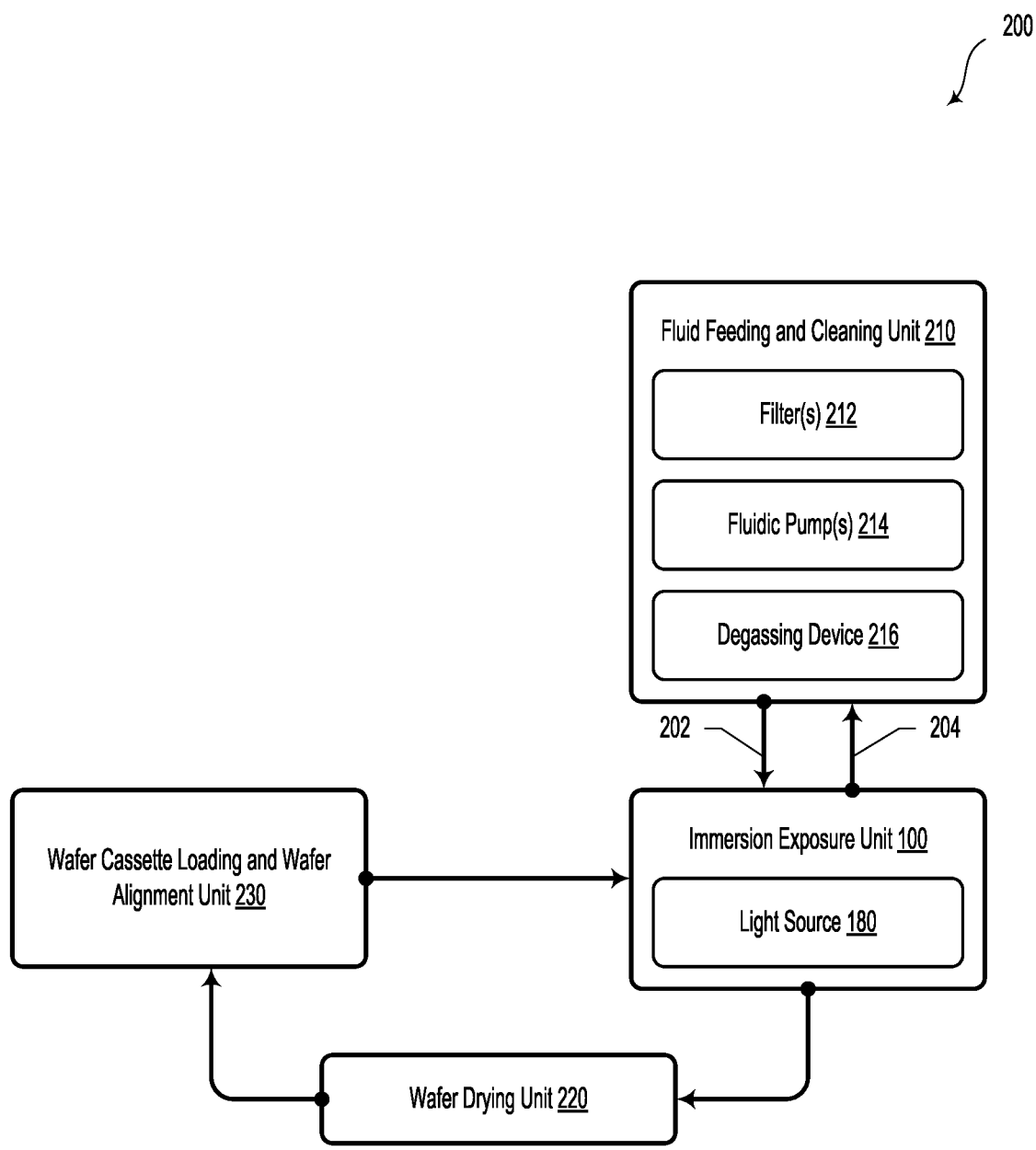
FIG. 2 illustrates a lithography system that includes the contact exposure unit of FIG. 1, according to an example embodiment.

FIG. 2 illustrates a lithography system 200 that includes the contact exposure unit 100 of FIG. 1, according to an example embodiment. In some embodiments, the lithography system 200 includes a fluid feeding and cleaning unit 210. The fluid feeding and cleaning unit 210 may include one or more filters 212. As an example, the filters 212 could include a 0.2 micron filter (20 inch length), a 0.1 micron filter (20 inch length), and a 0.04 micron filter (10 inch length). However, other types of particle filters are possible and contemplated.

The fluid feeding and cleaning unit 210 could also include one or more fluidic pumps 214. Additionally or alternatively, the fluid feeding and cleaning unit 210 may include a degassing device 216. The degassing device 216 could include a vacuum pump, a diaphragm/membrane pump, or another type of pump configured to remove gas from the fluid material 112. The fluid feeding and cleaning unit 210 could be coupled to the contact exposure unit 100 by way of a fluid feed hose 202 and a fluid return hose 204.

Lithography system 200 may additionally include a wafer drying unit 220. The wafer drying unit 220 could be configured to remove moisture from the substrate 120. For example, the wafer drying unit 220 could include a heating element configured to heat the substrate 120 to evaporate fluid on its surface. Additionally or alternatively, the wafer drying unit 220 could be configured to spin the substrate 120 at high RPM so as to remove fluid by centrifugal force and/or air flow.

Additionally or alternatively, the lithography system 200 could include a wafer cassette loading and wafer alignment unit 230.

Figure 3A:
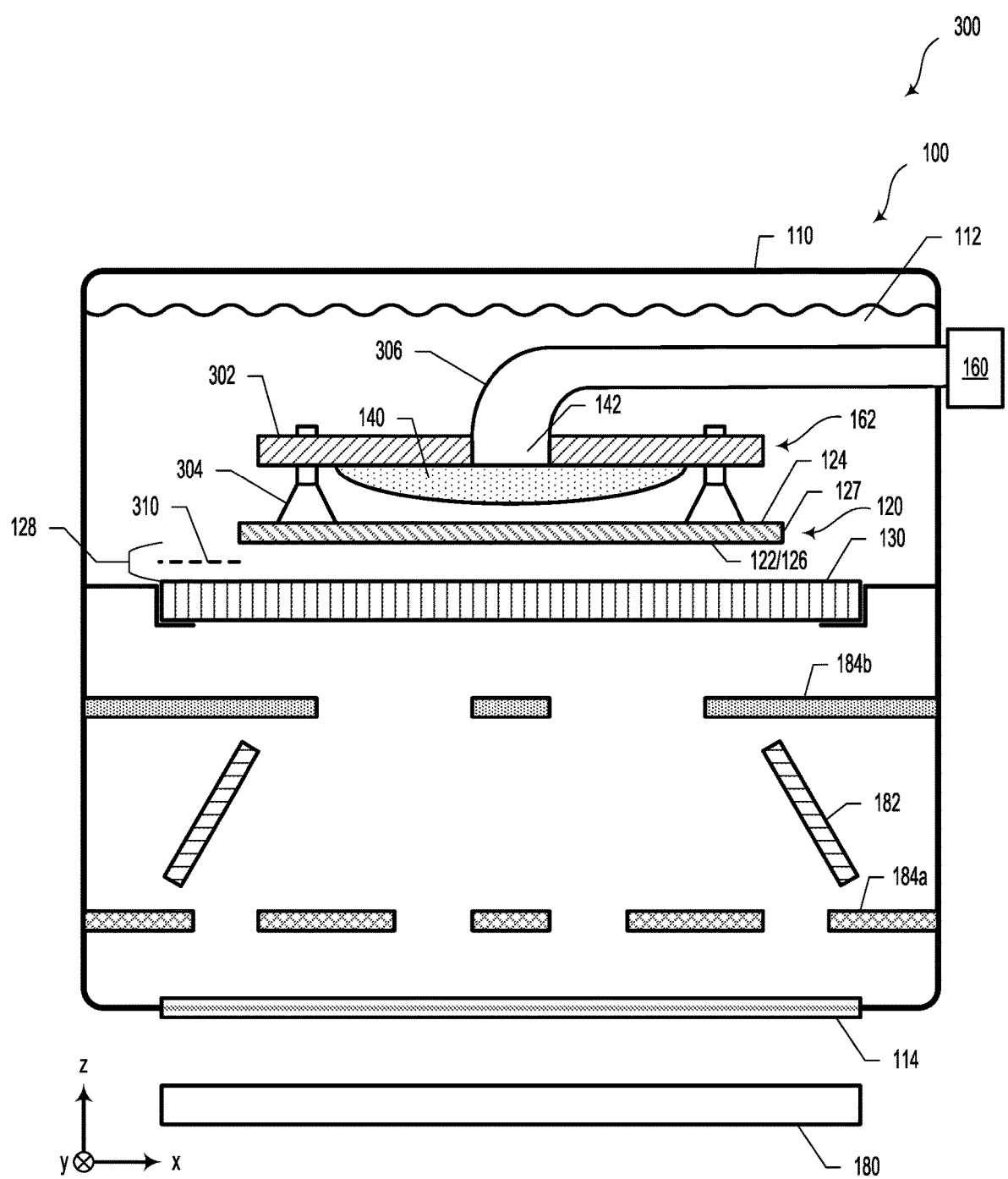
FIG. 3A illustrates a scenario including the contact exposure unit of FIG. 1, according to an example embodiment.

FIG. 3A illustrates a scenario 300 that includes the contact exposure unit 100 of FIG. 1, according to an example embodiment. Scenario 300 includes an inflation assembly 162, which may include a substrate 120 that is coupled to one or more vacuum suction cups 304 (e.g., four suction cups) that are attached to an apparatus with an inflatable balloon 140.

The inflatable balloon 140 may be operably inflated by way of gas port 142. The inflation assembly 162 may be attached to a container 110 by way of a support arm 306, which may additionally provide structural support for the inflation assembly 162 and/or a way to load/unload the substrate 120 into/out of the fluid material 112.

A first surface 122 of the substrate 120 may include a photoresist material 126 coated on the wafer/substrate body 127. A distance between the first surface 122 and the photomask 130 is shown as gap 128. In some embodiments, a desired gap 310 could provide a desired lithography condition. As an example, arranging the substrate 120 with the desired gap 310 with respect to the photomask 130 could provide the benefit of forming sharp, angled structures in the photoresist material 126. In some embodiments, the desired gap 310 could be between 5-10 microns, between 10-15 microns, or between 0-50 microns. It will be understood that other desired gaps are possible and contemplated.

As an initial operation, the inflation assembly 162 may be pressed down onto the substrate 120 with spring loaded vacuum suction cup. In some embodiments, the spring is very weak. In such scenarios, the vacuum suction cups will not push on the wafer very hard and are not likely to scratch or otherwise damage the surface of the photomask 130 or the substrate 120.

As illustrated in FIG. 3A, during scenario 300, the inflatable balloon 140 could be in deflated state.

Figure 3B:
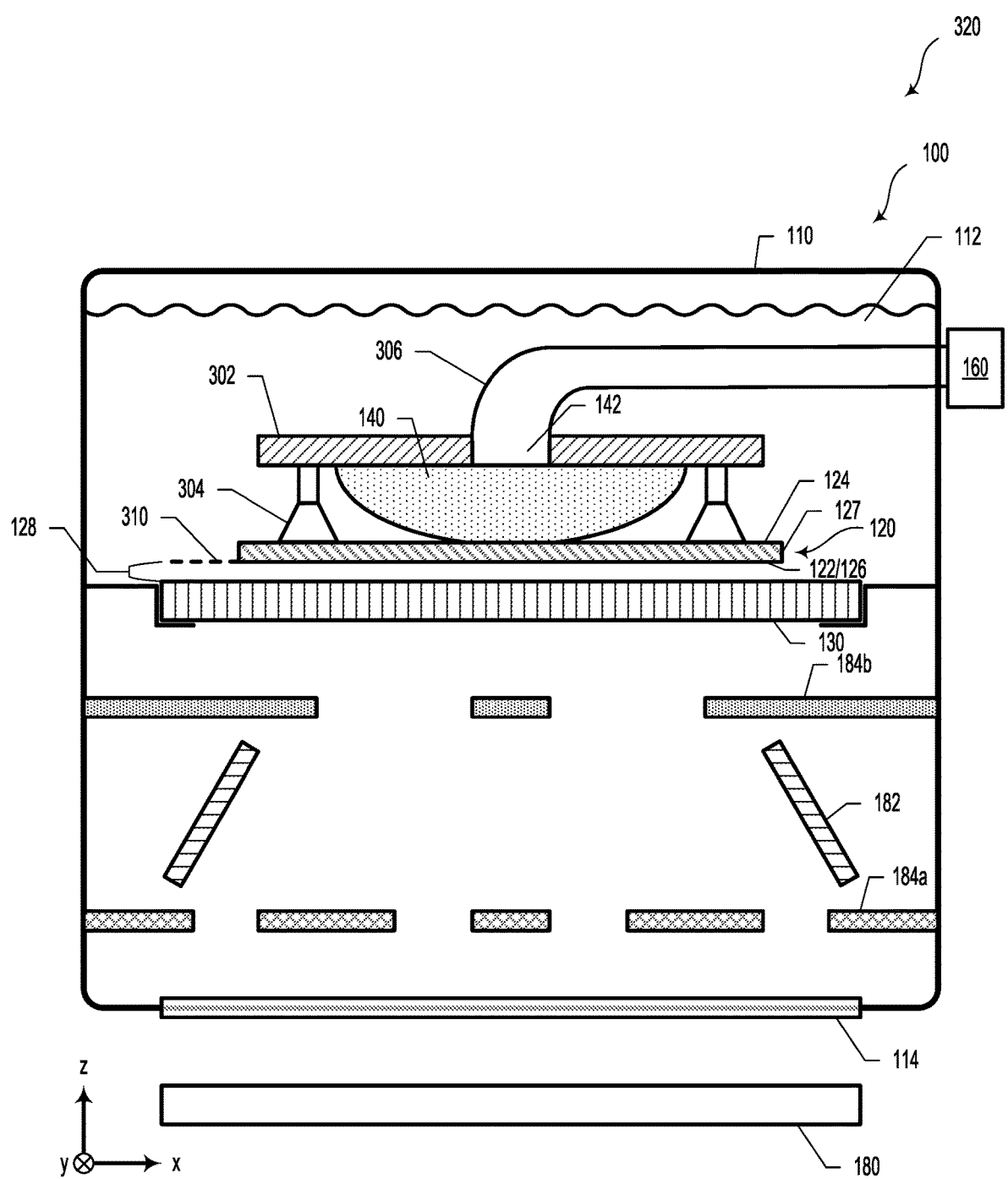
FIG. 3B illustrates a scenario including the contact exposure unit of FIG. 1, according to an example embodiment.

FIG. 3B illustrates a scenario 320 including the contact exposure unit 100 of FIG. 1, according to an example embodiment. As illustrated in FIG. 3B, the inflatable balloon 140 could be inflated by inflation device 160 by way of gas port 142. The gas utilized to inflate the inflatable balloon 140 could be air. However, other gases are possible and contemplated, such as nitrogen, argon, etc. The gas pressure and gas flow rate may be monitored and controlled to adjust and/or maintain the force and pressing speed of the substrate 120 with respect to the photomask 130.

In an example embodiment, a force of 5 N could be used. However, a variety of different pressing forces (e.g., 1-20 N)

are possible and contemplated. In some embodiments, the force could be calibrated by way of weights or other types of calibration measures.

By controlling the pressing force and time, the gap can be controlled, as predicted by the Stefan adhesion equation. The Stefan adhesion equation predicts the film thickness, ho, as a function of pressing time T and pressing force F.

$$FT = \frac{3}{2}\mu\pi a^4 \int_0^T \frac{h_t}{h^3} dt = \frac{3}{2}\mu\pi a^4 \int_{h_a}^{\infty} \frac{dh}{h^3} = \frac{3\mu\pi a^4}{4h_0^2}.$$

As an example, for a water-filled gap and a 10 N applied force, the Stefan adhesion equation predicts that it will take about 10 seconds to achieve a 10 micron gap. Additionally or alternatively, with a 5 N pressing force, a 30 second pressing duration may result in a 10 micron gap. As an alternative, lower forces, such as 2 N could be utilized. However, lower pressing forces may require longer pressing times to achieve the same gap. As yet another example, with a fixed pressing force of 10 N, a pressing duration of 100 seconds could provide an approximately 5 micron gap.

While not illustrated herein, it will be understood that the pressing force could be measured by way of a load cell or another force-measurement method.

Figure 3C:
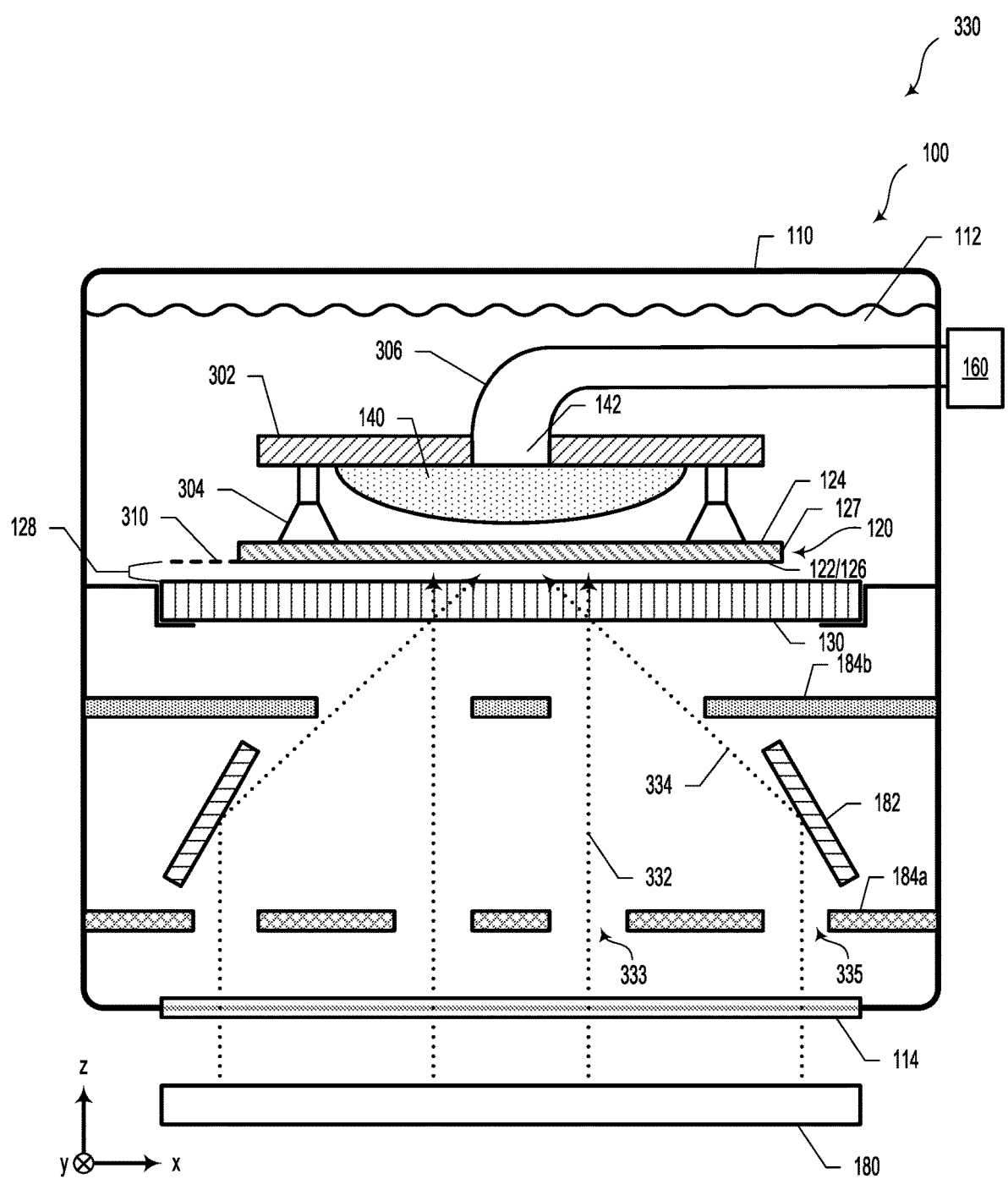
FIG. 3C illustrates a scenario including the contact exposure unit of FIG. 1, according to an example embodiment.

FIG. 3C illustrates a scenario 330 including the contact exposure unit 100 of FIG. 1, according to an example embodiment. As illustrated in scenario 330, once the gap 128 has been adjusted to be substantially equal to the desired gap 310, the inflatable balloon 140 could be partially deflated. In such scenarios, the gap 128 may be substantially maintained due to lack of a pushing or pulling force.

Furthermore, when the inflatable balloon 140 pulls away from the second surface 124 of the substrate 120, air bubbles at the second surface may dissipate avoiding potential sources of UV light reflection back to photoresist and/or scattering features.

Once the substrate 120 has been properly positioned with respect to the photomask 130, the light source 180 may be controlled so as to illuminate the photomask 130 and the substrate 120 with illumination light.

In some embodiments, a first portion 334 of the illumination light could be directed towards the optical component 182 by passing through a first opening 335 that corresponds to the angled structure.

Additionally or alternatively, a second portion 332 of the illumination light could be directed towards the substrate 120 by passing through a second opening 333 that corresponds to a desired vertical structure in the photoresist material 126. In such scenarios, the second portion of the illumination light illuminates the photoresist material 126 at a substantially normal angle to expose the desired vertical structure in the photoresist material 126.

Figure 3D:
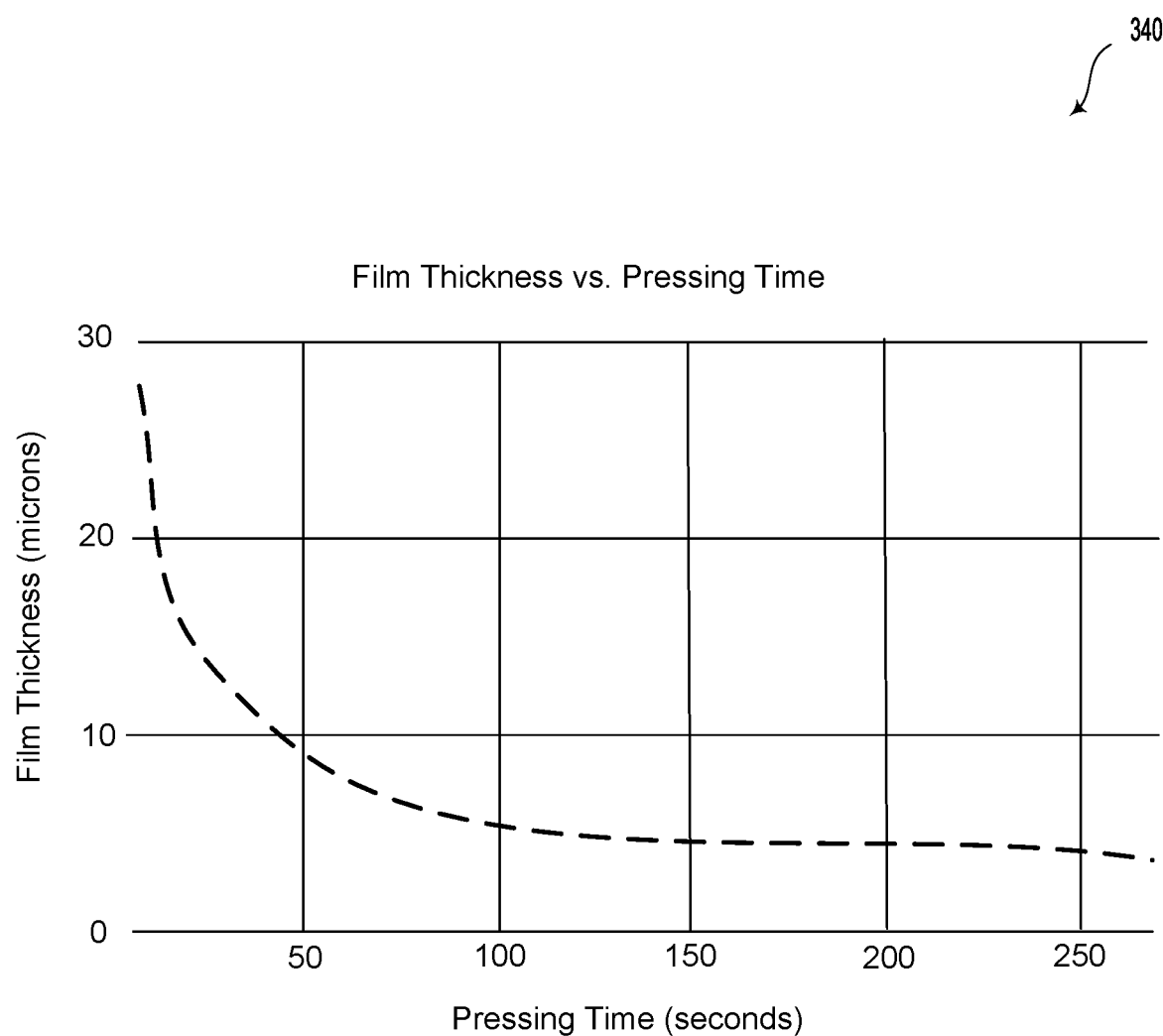
FIG. 3D illustrates film thickness versus pressing time involving the contact immersion exposure unit of FIG. 1, according to an example embodiment.

FIG. 3D illustrates a graph 340 of film thickness versus pressing time using the contact exposure unit 100 of FIG. 1, according to an example embodiment. The graph 340 could be based on the Stefan adhesion equation, which predicts a film thickness between two solids as a function of time for a given pressing force. While the graph in scenario 300 illustrates film thickness versus time for a 1ON pressing force, it will be understood that the Stefan adhesion equation may provide a family of curves that may be utilized within the context of the present disclosure. For example, for a desired gap and a given pressing force, the Stefan adhesion equation may provide a pressing duration to achieve the desired gap between the substrate and the photomask. That is, as described herein, the substrate may be pressed against the photomask (with a water layer separating the two surfaces) for the pressing duration in an effort to achieve the desired gap.

Figure 4:
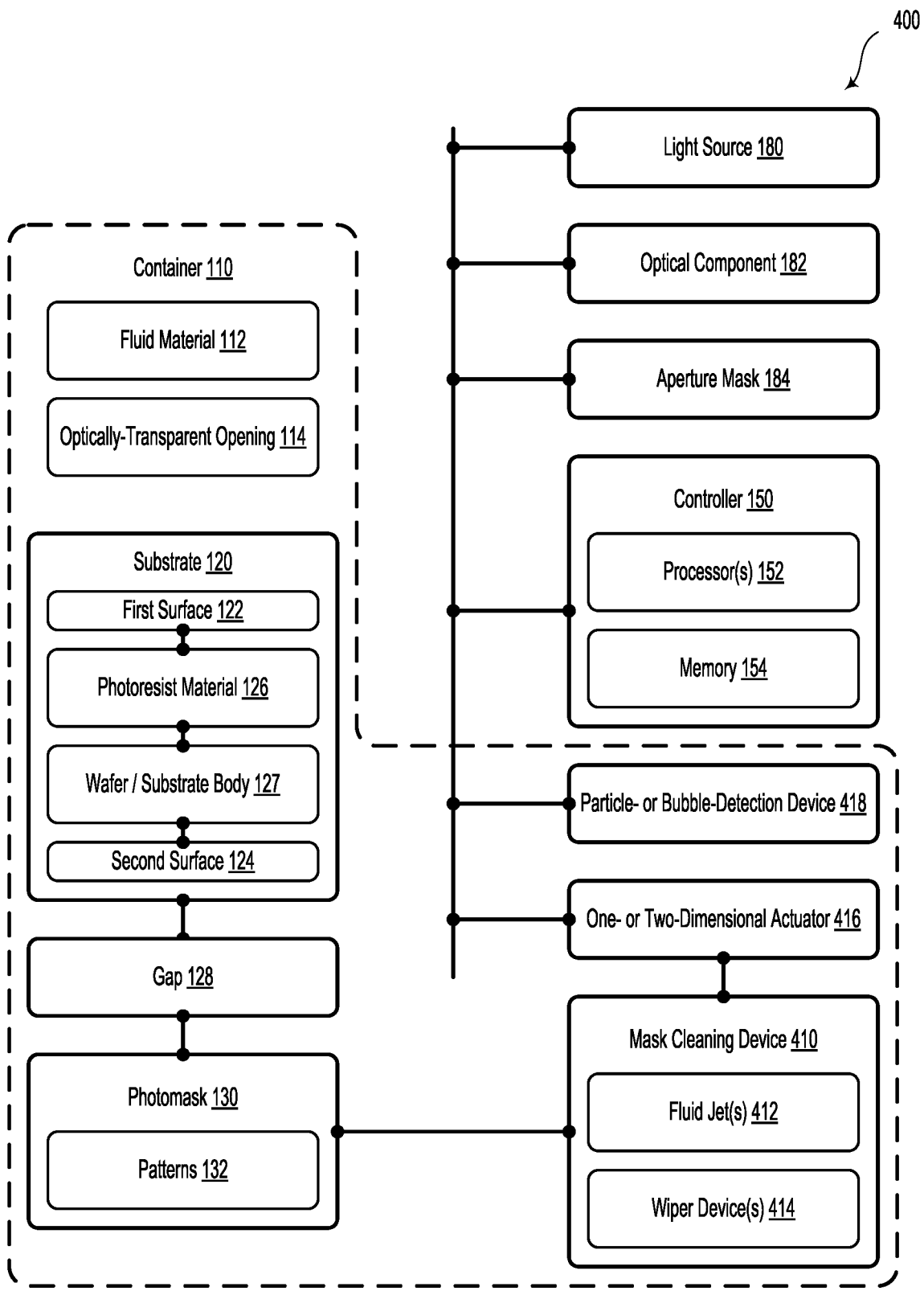
FIG. 4 illustrates a contact immersion lithography exposure unit, according to an example embodiment.

FIG. 4 illustrates a contact immersion lithography exposure unit 400, according to an example embodiment. At least some elements of contact exposure unit 400 could be similar to those of contact exposure unit 100. For example, the contact exposure unit 400 includes a container 110 configured to contain a fluid material 112. The contact exposure unit 400 additionally includes a photomask 130 disposed inside the container 110.

Additionally, the contact exposure unit 400 also includes at least one mask cleaning device 410 disposed inside the container 110. The at least one mask cleaning device 410 is configured to clean at least one surface of the photomask 130. In some embodiments, the mask cleaning device 410 may be configured to clean patterns 132 on the photomask 130. In various examples, the mask cleaning device 410 could be configured to clean both sides of the photomask 130. In yet further examples, the mask cleaning device 410 could be utilized to clean one or both sides of the substrate 120. Additionally or alternatively, while some embodiments include the mask cleaning device 410 being disposed inside the container 110, it will be understood that the mask cleaning device 410 could be located outside the container 110. For example, the mask cleaning device 410 could represent a robot configured to clean the mask between each exposure or after n exposures. In such cases, the robot/mask cleaning device 410 need not be disposed inside the container 110.

In some embodiments, the at least one mask cleaning device 410 could include at least one fluid jet 412. In some embodiments, the fluid jet(s) 412 could include nozzles configured to generate enough fluid sweeping force to clean the photomask 130 surface of debris (e.g., particles and/or dust). In some examples, once the fluid jet(s) 412 clean the photomask 130 surface, the system may go to a "slow sweep" mode, which may include a decreased fluid flow rate, to minimize the presence of bubbles on the photomask 130.

Additionally or alternatively, the at least one mask cleaning device 410 could include at least one wiper device 414.

In some examples, the contact exposure unit 400 could include a one- or two-dimensional actuator 416 configured to controllably adjust a position of the at least one mask cleaning device with respect to the surface to be cleaned (e.g., the photomask 130 or the substrate 120).

In various embodiments, the contact exposure unit 400 could include a particle- or bubble-detection device 418.

Similar to the contact exposure unit 100, the contact exposure unit 400 could include a controller 150 having at least one processor 152 and a memory 154. The at least one processor 152 executes program instructions stored in the memory 154 so as to carry out certain operations. As an example, the operations could include receiving, from the particle- or bubble-detection device 418, information about particles or bubbles present on the photomask 130. In such scenarios, the operations could include controlling the one- or two-dimensional actuator 416 based on the received information.

Figure 5A:
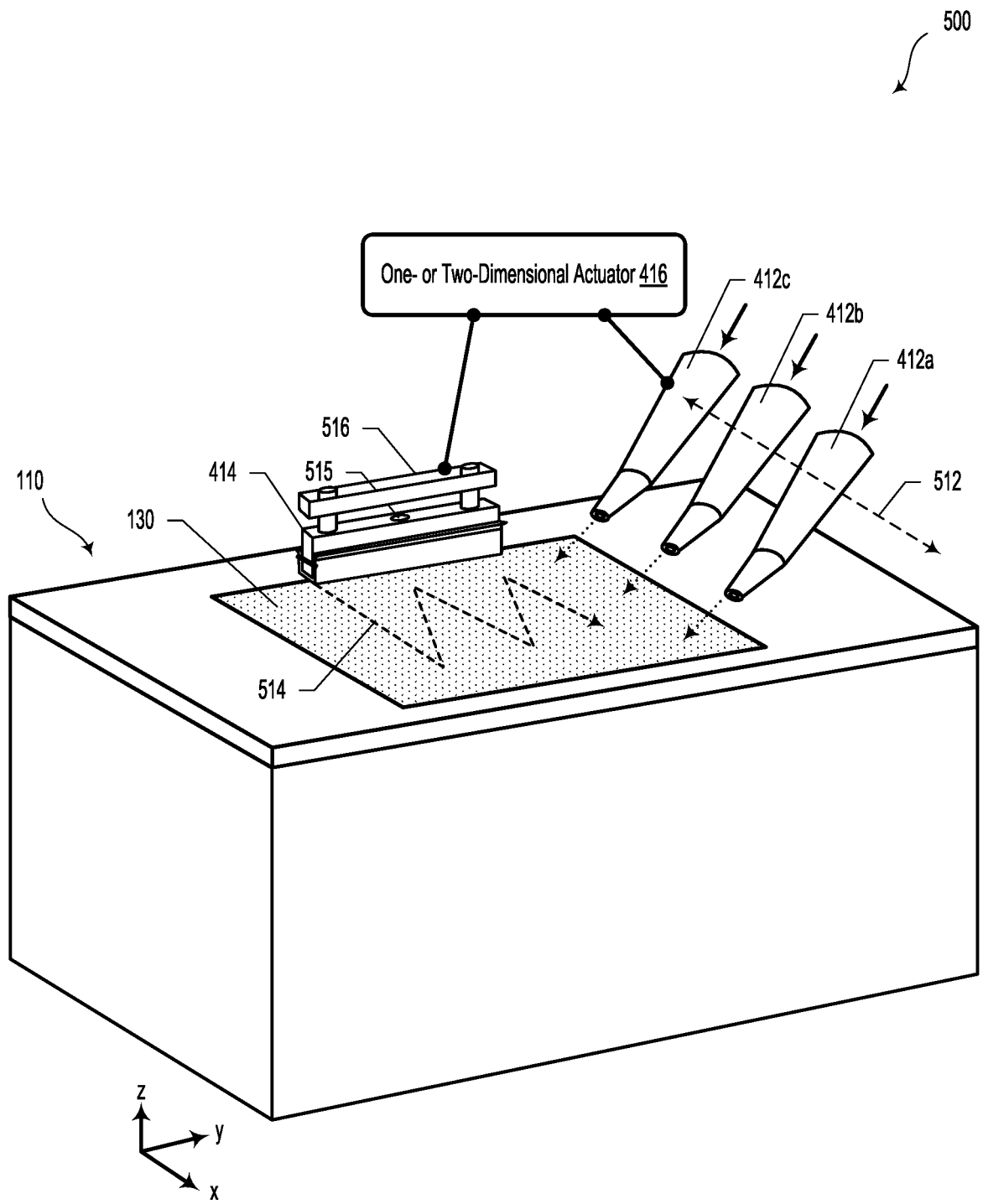
FIG. 5A illustrates a portion of the contact exposure unit of FIG. 4, according to an example embodiment.

FIG. 5A illustrates a portion 500 of the contact exposure unit 400 of FIG. 4, according to an example embodiment. The portion 500 of the contact exposure unit 400 includes a container 110 and photomask 130. As illustrated in FIG. 5A, the portion 500 of the contact exposure unit 400 may include a wiper device 414 coupled to a one- or a two-dimensional actuator 416. In such scenarios, the wiper device 414 could be moved along a wiping path 514 so as to clean a surface the photomask 130. Additionally or alternatively, the wiper device 414 could be configured to be actuated as a rotary wiper, similar to a rotary toothbrush, or a paint roller.

In some embodiments, the wiper device 414 could include a pin and bar arrangement 516, which could be connected to an actuator (e.g., the one- or two-dimensional actuator 416). In some embodiments, the pin and bar arrangement 516 could include one or more springs configured to level the wiper device 414 with respect to the photomask 130 and also to control the pressing force.

In some embodiments, a fluid, such as water, could be provided via fluid inlet 515. In some examples, the fluid could be provided via the fluid inlet 515 with a pressure between 0-100 pounds per square inch (PSI). In such scenarios, the fluid could saturate an open-cell foam material on the wiper device 414, which may be beneficial for removing dust and other types of debris.

Additionally, FIG. 5A illustrates a plurality of fluid jets (e.g., fluid jets 412a, 412b, and 412c). The fluid jets 412a, 412b, and 412c could be coupled to the one- or two-dimensional actuator 416 or another actuator. Accordingly, a stream of the fluid jets could be moved with respect to the photomask 130 (e.g., along fluid jet path 512) so as to remove debris and dust from the photomask 130.

Figure 5B:
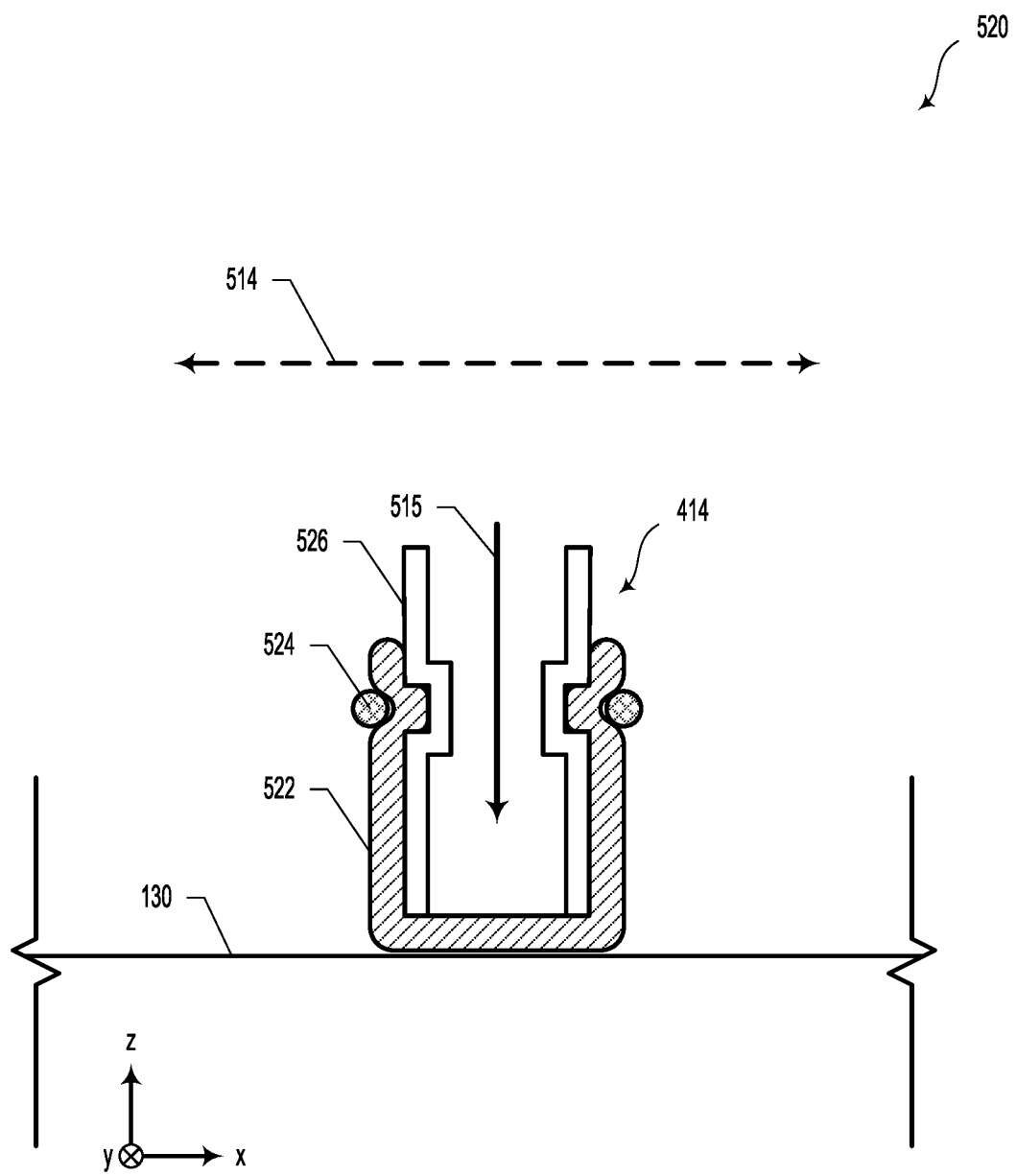
FIG. 5B illustrates a portion of the contact exposure unit of FIG. 4, according to an example embodiment.

FIG. 5B illustrates a portion 520 of the contact exposure unit 400 of FIG. 4, according to an example embodiment. The portion 520 includes a cross-sectional view of the wiper device 414. As illustrated in FIG. 5B, the wiper device 414 could include a wiper body 526 that could be at least partially hollow. Fluid inlet 515 could accept water or another fluid (e.g., from a fluid pump). The fluid could be forced through the wiper body 526 to a sponge wiper 522. The sponge wiper 522 could include a sponge-type material (e.g., polyvinyl acetate (PVA) or Ethylene-vinyl acetate (EVA)). However, other types of materials (e.g., open-cell foams) are possible and contemplated. As illustrated in FIG. 5B, the sponge wiper 522 could be removably-fastened to the wiper body 526 by way of one or more clips 524.

It will be understood that the wiper device 414 could be coupled to a one- or multi-axis (X, Y, and Z) actuator and/or movement stage. In such scenarios, the actuator or stage could be configured to move the wiper device 414 with respect to the photomask.

III. Example Methods

Figure 6:
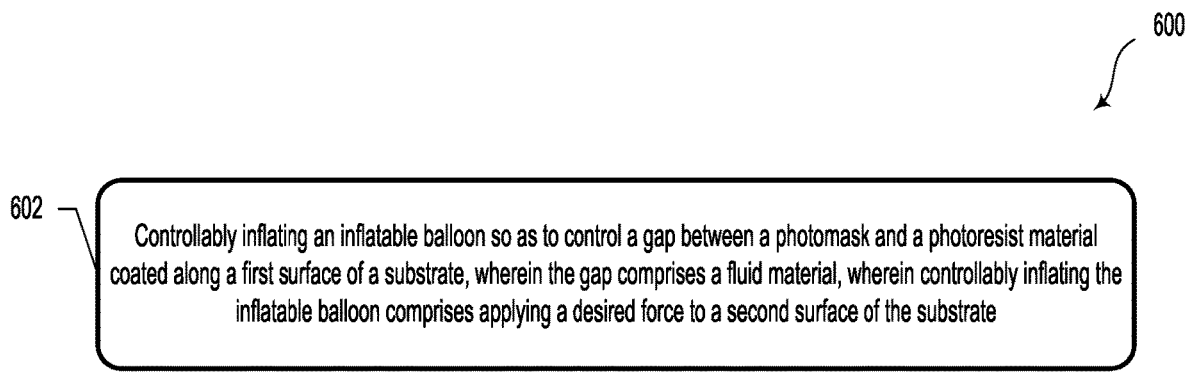
FIG. 6 illustrates a method, according to an example embodiment.

FIG. 6 illustrates a method 600, according to an example embodiment. While method 600 illustrates one block of a method of manufacture, it will be understood that more blocks or steps could be included. In such scenarios, at least some of the various blocks or steps may be carried out in a different order than of that presented herein. Furthermore, blocks or steps may be added, subtracted, transposed, and/or repeated. Some or all of the blocks or steps of method 600 may be carried out by contact/immersion exposure units 100 or 400, as illustrated and described in reference to FIGS. 1 and 4.

Block 602 includes controllably inflating an inflatable balloon (e.g., inflatable balloon 140) so as to control a gap (e.g., gap 128) between a photomask (e.g., photomask 130) and a photoresist material (e.g., photoresist material 126) coated along a first surface (e.g., first surface 122) of a substrate (e.g., substrate 120). The gap includes a fluid material (e.g., fluid material 112). In such scenarios, controllably inflating the inflatable balloon includes applying a desired force to a second surface (e.g., second surface 124) of the substrate.

In some embodiments, method 600 may include attaching an inflation assembly (e.g., inflation assembly 162) to the second surface of the substrate by way of a plurality of vacuum suction cups (e.g., vacuum suction cups 304). In such scenarios, the inflation assembly includes the inflatable balloon and a control valve (e.g., control valve 164).

The inflation assembly may additionally include an inflation device (e.g., inflation device 160). In such scenarios, the inflation device may be coupled to the inflatable balloon by way of the control valve.

In various embodiments, controllably inflating the inflatable balloon includes controlling at least one of: a pressure of an inflating fluid (e.g., gas and/or liquid) of the inflatable balloon, an inflating fluid flow rate, or an applied force duration.

In some embodiments, method 600 may additionally include determining the applied force duration according to the Stefan adhesion equation. In such scenarios, controllably inflating the inflatable balloon could include inflating the inflatable balloon during the determined applied force duration.

Figure 7:
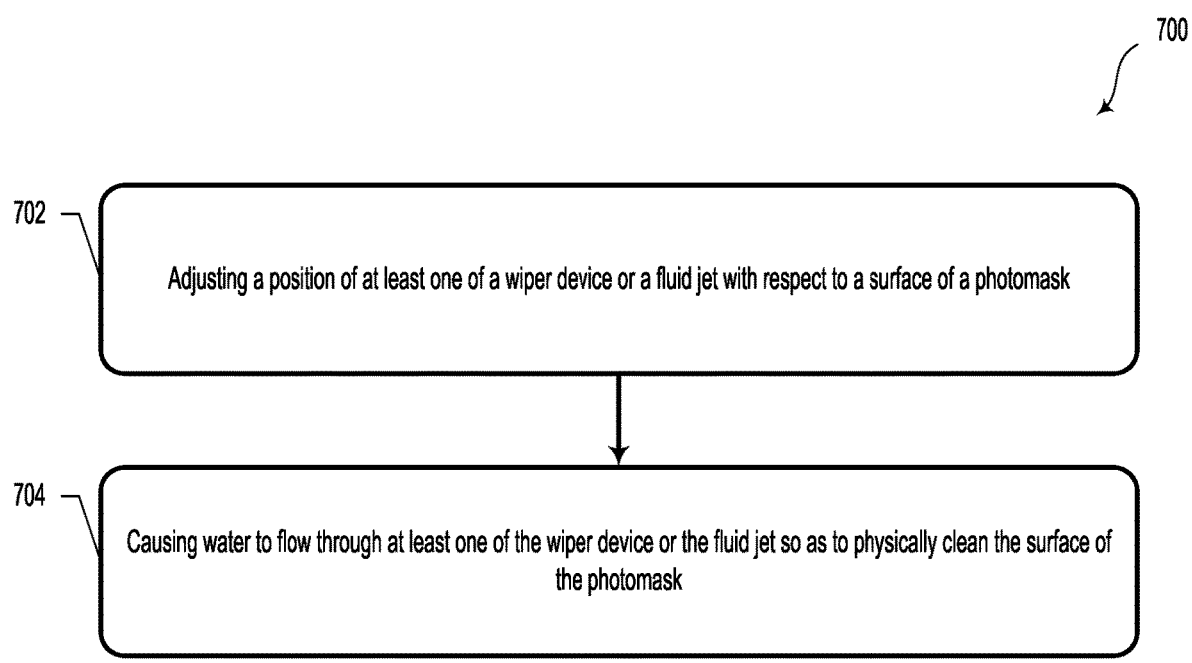
FIG. 7 illustrates a method, according to an example embodiment.

FIG. 7 illustrates a method 700, according to an example embodiment. FIG. 7 illustrates a method 700, according to an example embodiment. Method 700 includes various blocks or steps of a method of manufacture, according to one or more example embodiments. It will be understood that at least some of the various steps may be carried out in a different order than of that presented herein. Furthermore, steps may be added, subtracted, transposed, and/or repeated. Some or all of the blocks or steps may be carried out by contact/immersion exposure units 100 or 400, as illustrated and described in reference to FIGS. 1 and 4.

Block 702 includes adjusting a position of at least one of a wiper device (e.g., wiper device 414) or a fluid jet (e.g., 412) with respect to a surface of a photomask (e.g., photomask 130).

Block 704 includes causing fluid (e.g., water) to flow through at least one of the wiper device or the fluid jet so as to physically clean the surface of the photomask.

In some embodiments, as described herein, method 700 could include continuously moving the wiper device with respect to the photomask so as to clean the photomask by physically and/or fluidically wiping the photomask with the wiper device.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. An exposure unit comprising:
   a container configured to contain a fluid material;
   a photomask; and
   at least one mask cleaning device, wherein the at least one mask cleaning device is configured to clean at least one surface of the photomask;
   a one- or two-dimensional actuator configured to controllably adjust a position of the at least one mask cleaning device;
   a particle- or bubble-detection device;
   a fluid feeding and cleaning unit, wherein the fluid feeding and cleaning unit comprises one or more filters; and
   a controller having at least one processor and a memory, wherein the at least one processor executes program instructions stored in the memory so as to carry out operations, the operations comprising:
      receiving, from the particle- or bubble-detection device, information indicative of particles or bubbles present on the photomask; and
      in response to receiving the information indicative of particles or bubbles present on the photomask, controlling the one- or two-dimensional actuator.

2. The exposure unit of claim 1, wherein the at least one mask cleaning device comprises at least one fluid jet.

3. The exposure unit of claim 2, wherein the at least one fluid jet comprises one or more nozzles configured to remove debris from at the at least one surface of the photomask.

4. The exposure unit of claim 1, wherein the at least one mask cleaning device comprises at least one wiper device.

5. The exposure unit of claim 4, wherein the at least one wiper device comprises a pin-and-bar wiper arrangement, a rotary wiper, or a roller wiper.

6. The exposure unit of claim 5, wherein the at least one wiper device comprises a pin-and-bar wiper arrangement, wherein the at least one wiper device is configured to provide a fluid via a fluid inlet with a pressure between 0-100 pounds per square inch.

7. The exposure unit of claim 6, wherein the at least one wiper device comprises an open-cell foam material configured to remove dust and debris.

8. The exposure unit of claim 1, wherein the at least one mask cleaning device is configured to clean both sides of the photomask.

9. The exposure unit of claim 1, wherein the one or more filters comprise: a 0.2 micron filter, a 0.1 micron filter, and a 0.04 micron filter.

10. The exposure unit of claim 1, wherein the fluid feeding and cleaning unit comprises a degassing device, wherein the degassing device comprises at least one of: a vacuum pump or a diaphragm/membrane pump configured to remove gas from the fluid material.

11. The exposure unit of claim 1, further comprising:
   a light source configured to produce illumination light, wherein the light source is optically coupled to the container, wherein the light source is a collimated ultraviolet (UV) lamp.

12. The exposure unit of claim 1, wherein the fluid material comprises at least one of: water, glycol, glycerol, or a mixture thereof.

13. The exposure unit of claim 1, wherein the fluid feeding and cleaning unit comprises one or more fluidic pumps.

14. The exposure unit of claim 1, wherein the fluid feeding and cleaning unit is coupled to the container by way of a fluid feed hose and a fluid return hose.

15. A photolithography method comprising:
   receiving, from a particle- or bubble-detection device, information indicative of particles or bubbles present on a photomask;
   in response to receiving the information indicative of particles or bubbles present on the photomask, adjusting a position of at least one of a wiper device or a fluid jet with respect to a surface of the photomask; and
   causing a fluid to flow through a fluid feeding and cleaning unit and at least one of the wiper device or the fluid jet so as to physically clean the surface of the photomask, wherein the fluid feeding and cleaning unit comprises one or more filters.

16. The photolithography method of claim 15, wherein the fluid jet comprises one or more nozzles configured to remove debris from at the surface of the photomask.

17. The photolithography method of claim 15, wherein the at least one wiper device comprises a pin-and-bar wiper arrangement, a rotary wiper, or a roller wiper.

18. The photolithography method of claim 15, further comprising degassing the fluid with a degassing device, wherein the degassing device comprises at least one of: a vacuum pump or a diaphragm/membrane pump configured to remove gas from the fluid material.

19. The photolithography method of claim 15, further comprising determining, from a particle- or bubble-detection device, information indicative of particles or bubbles on the photomask.

\* \* \* \* \*